United States Patent
Tsai et al.

(10) Patent No.: US 6,506,291 B2
(45) Date of Patent: Jan. 14, 2003

(54) SUBSTRATE SUPPORT WITH MULTILEVEL HEAT TRANSFER MECHANISM

(75) Inventors: Cheng-Hsiung Tsai, Cupertino, CA (US); Chien-Shiung Tzou, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/881,902

(22) Filed: Jun. 14, 2001

(65) Prior Publication Data

US 2002/0189940 A1 Dec. 19, 2002

(51) Int. Cl.[7] .............................................. C23C 14/50
(52) U.S. Cl. .................. 204/298.15; 118/728; 118/729; 118/724; 156/245.51; 156/345.52; 156/345.53
(58) Field of Search ....................... 204/298.15, 298.07; 118/728, 729, 724; 156/345, 345.51, 345.52, 345.53

(56) References Cited

U.S. PATENT DOCUMENTS

| 4,184,188 A | 1/1980 | Briglia ........................ 361/234 |
| 4,384,918 A | 5/1983 | Abe ............................ 156/643 |
| 5,117,121 A | 5/1992 | Watanabe et al. ............ 307/130 |
| 5,350,479 A | 9/1994 | Collins et al. ............... 156/345 |
| 5,382,311 A | 1/1995 | Ishikawa et al. ............. 156/345 |
| 5,511,799 A | 4/1996 | Davenport et al. .......... 277/236 |
| 5,522,131 A | 6/1996 | Steger .......................... 29/829 |
| 5,531,835 A * | 7/1996 | Fodor et al. ................. 118/728 |
| 5,583,736 A | 12/1996 | Anderson et al. ............ 361/234 |
| 5,656,093 A | 8/1997 | Burkhart et al. ............. 118/728 |
| 5,738,751 A | 4/1998 | Camerson .................... 156/345 |
| 5,753,132 A | 5/1998 | Shamouilian et al. .......... 216/33 |
| 5,810,933 A | 9/1998 | Mountsier et al. ........... 118/724 |
| 5,904,776 A | 5/1999 | Donde et al. ................ 118/500 |
| 6,033,478 A | 3/2000 | Kholodenko ................ 118/500 |
| 6,077,357 A | 6/2000 | Rossman et al. ............ 118/728 |
| 6,089,181 A | 7/2000 | Suemasa et al. ......... 118/723 E |

\* cited by examiner

Primary Examiner—Rodney G. McDonald
(74) Attorney, Agent, or Firm—Moser, Patterson & Sheridan

(57) ABSTRACT

A substrate support having heat transfer enhancing topography. Generally, the substrate support includes a first side that supports the substrate and a second side. A ring and a plurality of substrate support pads project from the first side. The ring is disposed proximate the perimeter of the substrate support. A fluid passage is disposed through the substrate support and is coupled to a well disposed in the first side. A plurality of gas flow channels are disposed in the first side and orientated radially outward from the well to a perimeter channel disposed radially inward and adjacent to the ring.

24 Claims, 5 Drawing Sheets

SUBSTRATE SUPPORT WITH MULTILEVEL HEAT TRANSFER MECHANISM

BACKGROUND OF THE INVENTION

1. Field of the Invention

Embodiments of the invention generally relate to a substrate support for supporting a substrate in a semiconductor processing chamber.

2. Description of the Related Art

Many semiconductor processes are typically performed in a vacuum environment. For example, physical vapor deposition (PVD) is generally performed in a sealed chamber having a pedestal for supporting the substrate disposed therein. The pedestal typically includes a ceramic substrate support that has electrodes disposed therein to electrostatically hold the substrate against the ceramic substrate support. A target generally comprised of a material to be deposited on the substrate is supported above the substrate, typically fastened to a top of the chamber. A plasma is formed from a gas such as argon that is supplied between the substrate and the target. The target is biased causing ions within the plasma to be accelerated toward the target. The ions impacting the target cause material to become dislodged from the target. The dislodged target material is attracted towards the substrate and deposits a film of material thereon.

Temperature control of the substrate during deposition is one consideration for good deposition performance. Generally, the temperature of the substrate is regulated by transferring heat between the substrate and the substrate support. As heat transfer in the vacuum environment of the process chamber is inefficient, a backside gas, such as argon or helium, is disposed between the substrate and the ceramic substrate support as a heat transfer medium.

Many substrate supports incorporate features which space the substrate from the support surface thereby providing a plenum for backside gas. Generally, these features maintain the substrate in a spaced-apart relation to the support surface at a distance that maximizes heat transfer through the backside gas. Although the optimal distance varies with the specific gas or gases used, the distance between the support surface and the substrate across the plenum is generally maintained at less than about 40 μm in conventional designs.

Generally, backside gas is provided to the plenum through a central conduit disposed near the center of the substrate support. As the space between the substrate and substrate support is narrow, the pressure drop of the backside gas flowing radially outward across the support surface often prevents uniform distribution of a backside gas across the full radial width of the plenum. The non-uniformed distribution of backside gas generally creates a concentration of backside gas near the center of the support, thus causing a higher rate of heat transfer in the center area as compared to the heat transfer rate near the substrate's edge. This results in temperature gradients on the substrate and correspondingly, poor process performance.

Therefore, there is a need for a substrate support having improved heat transfer characteristics.

SUMMARY OF THE INVENTION

A substrate support for supporting a substrate in a semiconductor process chamber is provided. In one embodiment, the substrate support generally includes a first side that supports the substrate and a second side disposed opposite the first side. The first and second sides are coupled by a perimeter. A ring and a plurality of substrate support pads extend from the first side. The ring is disposed proximate the perimeter of the substrate support. A fluid passage is disposed through the substrate support and is coupled to a well disposed in the first side. A plurality of gas flow channels are disposed in the first side and orientated radially outward from the well to a perimeter channel disposed radially inward and adjacent to the ring. The well and channels are adapted to provide uniform distribution of backside gas across the first side of the substrate support.

DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Embodiments of the invention generally provide a substrate support for supporting a substrate in a semiconductor process chamber having a topography that enhances thermal conductivity between the support and the substrate. Although the invention is disclosed as a substrate support utilized in a physical vapor deposition chamber, the invention finds utility in other semiconductor processing chambers such as ion plant, chemical vapor deposition, etching and other applications where it is advantageous to control heat transfer between substrates and substrate supports.

Figure 1:
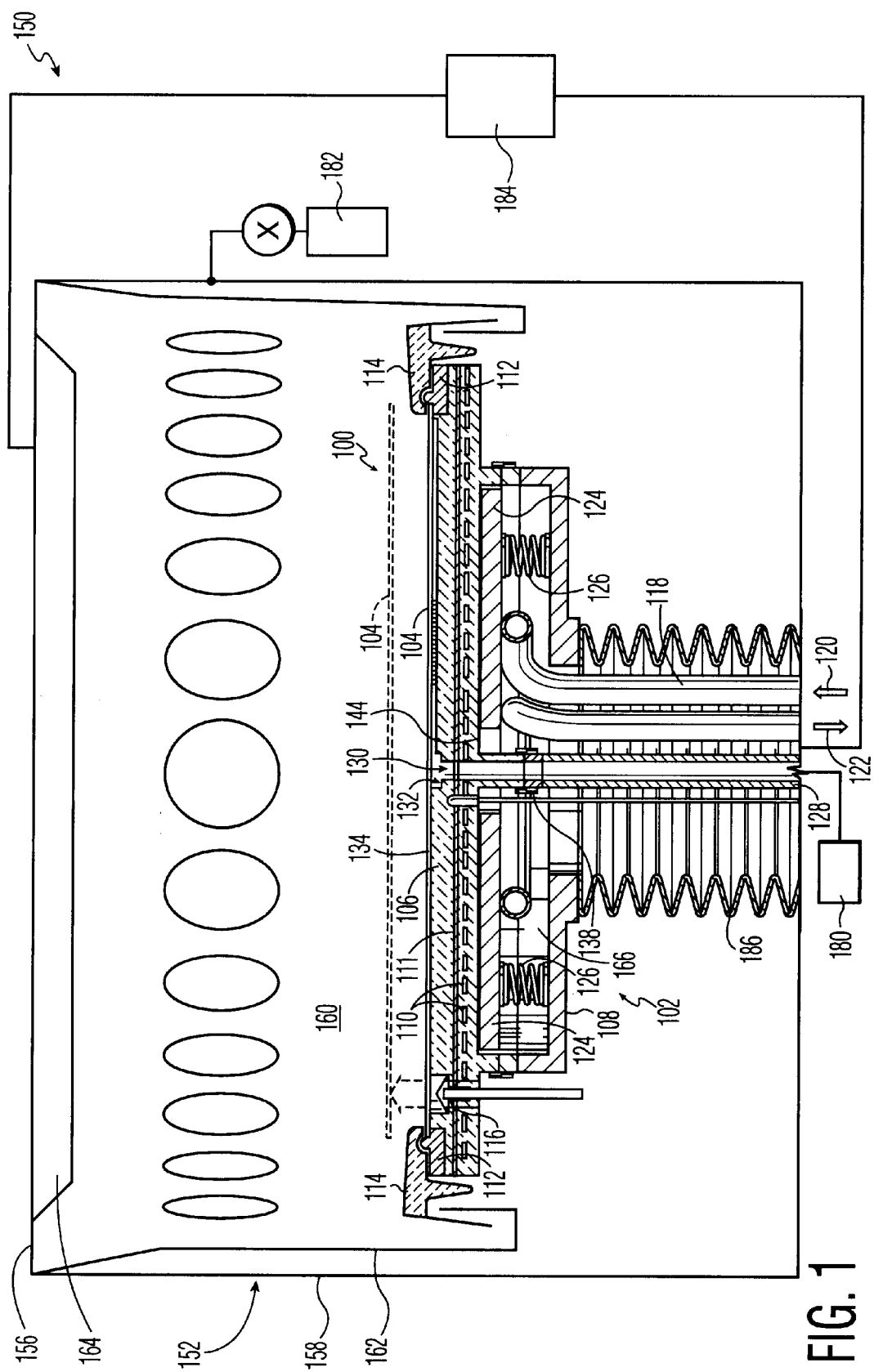
FIG. 1 depicts a semiconductor process chamber illustrating one embodiment of a substrate support disposed therein.

FIG. 1 depicts a semiconductor process chamber 150 having one embodiment of a pedestal assembly 100 disposed therein. Generally, the pedestal assembly 100 both supports and regulates the temperature of a substrate 104 disposed thereon during processing. One example of a process chamber that may be adapted to benefit from the invention is an IMP VECTRA™ PVD process chamber, available from Applied Materials, Inc., of Santa Clara, Calif.

The exemplary process chamber 150 includes a chamber body 152 having a bottom 154, a lid 156 and sidewalls 158 that define an evacuable volume 160. The bottom 154 and sidewalls 158 are typically fabricated from a unitary block of aluminum. The sidewalls 158 generally contain a sealable port or "slit valve" (not shown) to provide for entrance and egress of the substrate 104 from the process chamber 150. The lid 156 of the chamber 150 generally supports an annular shield 162 suspended therefrom that supports a shadow ring 114. The shadow ring 114 is generally configured to confine deposition to a portion of the substrate 104 exposed through the center of the shadow ring 114, thus shielding the other portions of the substrate support from the flow of deposition materials.

A target 164 is coupled to the lid 156 of the chamber body 152. The target 164 provides material that is deposited on the substrate 104 during the PVD process. The target 164 and pedestal assembly 100 are biased relative each other by a power source 184. A gas such as argon is supplied to the volume 160 from a gas source 182. A plasma is formed between the substrate 104 and the target 164 from the gas. Ions within the plasma are accelerated toward the target 164 and cause material to become dislodged from the target 164. The dislodged target material is attracted towards the substrate 104 and deposits a film of material thereon.

The pedestal assembly 100 is generally disposed on the bottom 154 of the chamber 150 and supports the substrate 104 during processing. The pedestal assembly 100 is coupled to the bottom 156 by a lift mechanism (not shown) that is configured to move the pedestal assembly 150 between an upper (as shown) and lower position. In the upper position, the pedestal assembly 100 and engages the shadow ring 114, lifting the shadow ring 114 from the shield 162 to protect the substrate support from deposition materials as described above.

In the lower position, the pedestal assembly 100 is positioned below the shield 162 which allows the substrate 104 to be removed from the chamber 150 through the port in the sidewall 158 while clearing the ring 114 and shield 162. Additionally, in the lower position, lift pins 116 are moved through the pedestal assembly 100 to space the substrate 104 from the pedestal assembly 100 to facilitate securing of the substrate 104 by a wafer transfer mechanism disposed exterior to the process chamber 150 such as a transfer robot (not shown). A bellows 186 is typically disposed between the pedestal assembly 100 and the chamber bottom 154 to isolate the evacuable chamber volume 160 from the interior of the pedestal assembly 100.

The pedestal assembly 100 generally includes a substrate support 102 sealingly coupled to a platform housing 108. The platform housing 108 is typically fabricated from a metallic material such as stainless steel or aluminum. A temperature control plate 124 is generally disposed within the sealed volume between the substrate support 102 and the platform housing 108 to thermally regulate the substrate support 102. One pedestal assembly 100 that may be adapted to benefit from the invention is described in U.S. Pat. No. 5,507,499, issued Apr. 16, 1996 to Davenport et al., which is incorporated herein by reference in its entirety.

The substrate support 102 may be comprised of any material suitable for use to support a substrate in a processing chamber, for example, metal, ceramic or combinations thereof. The substrate support 102 may be a susceptor, a heater, an electrostatic chuck and the like. A susceptor is generally a body adapted to support a substrate during processing. The substrate may be retained to the susceptor via physical clamps, vacuum force, electrostatic force (e.g. an electrostatic chuck) and may additionally include a heating element (e.g. a heater).

A heater generally has a heat transfer element embedded in a body or disposed proximate thereto. The heat transfer element is generally a resistive element such as a conductive member, for example, a graphite foil. The heat transfer element may alternatively be a conduit through which a fluid flows. Generally, the fluid cools or heats the heater body to control the temperature of the substrate disposed on the body. One example of a heater that may be adapted to benefit from the invention is described in U.S. Pat. No. 6,179,924, issued Jan. 30, 2001 to Zhao, et al., and is incorporated herein by reference in its entirety.

In one embodiment, the substrate support 102 is an electrostatic chuck that includes a dielectric body 106 having a conductive layer such as an electrode 111 embedded therein. The dielectric body 106 is typically fabricated from a material having high thermal conductivity, for example, a dielectric such as pyrolytic boron nitride, aluminum nitride, silicon nitride, alumina or equivalent material.

The dielectric body 106 may additionally contain embedded, electrically conductive heating elements 110 that can be used to heat the substrate support 102. Optionally, the substrate support 102 comprises a removable insert 112. The insert 112 is a recyclable element that is used to capture back-scattered deposition materials and to prevent the need to clean dielectric body 106. The insert 112 is constructed from a relatively inexpensive material having a coefficient of expansion similar to that of the dielectric material comprising the dielectric body 106.

Thermal energy is added or removed from the dielectric body 106 by the temperature control plate 124. The temperature control plate 124 is generally disposed against a lower side 144 of the dielectric body 106. The temperature control plate 124 is typically fabricated from a material having good thermal conductivity to promote uniform heat transfer between the temperature control plate 124 and the dielectric body 106. The temperature control plate 124 is typically fabricated from copper, stainless steel, tungsten, molybdenum, or Kovar®. In an alternative embodiment of temperature control plate 124, a layer of material having a low linear thermal expansion coefficient, such as tungsten, molybdenum, or Kovar® may be disposed on the side of the temperature control plate 124 facing the lower side 144 of the dielectric body 106.

A cooling coil 118 is generally disposed in or proximate the temperature control plate 124. The cooling coil 118 is typically fabricated from aluminum, stainless steel or copper. The cooling coil 118 has a heat transfer fluid flowing therethrough supplied from a thermally regulated external fluid source (not shown). The heat transfer fluid enters the cooling coil 118 at a first port 120 and exits through a second port 122, thereby removing heat (or adding heat) to the temperature control plate 124 as the first heat transfer fluid passes through the coil 118.

One or more springs 126 are disposed between the platform housing 108 and the temperature control plate 124. The springs 126 bias the temperature control plate 124 against the dielectric body 106 to maintain close contact between the dielectric body 106 and the temperature control plate 124. Typically, the springs 126 load the temperature control plate 124 against the substrate support 102 with about 5 to about 50 psi. Loads in excess of 50 psi may damage a brazed seal 140 disposed between the platform housing 108 and the dielectric body 106.

The substrate 104 is thermally regulated by passing heat (i.e., thermal energy) between the substrate 104 and substrate support 102. As processing of the substrate 104 is generally carried out in a partial vacuum, wherein the absolute pressure of the evacuable chamber volume 160 is frequently as low as 0.1 mTorr, a backside gas is typically used to enhance heat transfer between the substrate 104 and the dielectric body 106 of the substrate support 102. A conduit 128 is disposed through the pedestal assembly 100 to transfer the backside gas from a gas source 180 to a region defined between the dielectric body 106 and the substrate 104. The conduit 128 is attached to a passage 130 in the dielectric body 106 by a seal 138. The conduit 128 supplies the backside gas through the passage 130 disposed in the body 106 to a well 132 formed in an upper side 134 of the support platen 106. The backside gas flows outward from the well 132 to fill the interstitial space between the body 106 and the substrate 104. The backside gas provides a heat transfer medium through which thermal energy is transferred between the substrate 104 and the dielectric body 106.

Figure 2:
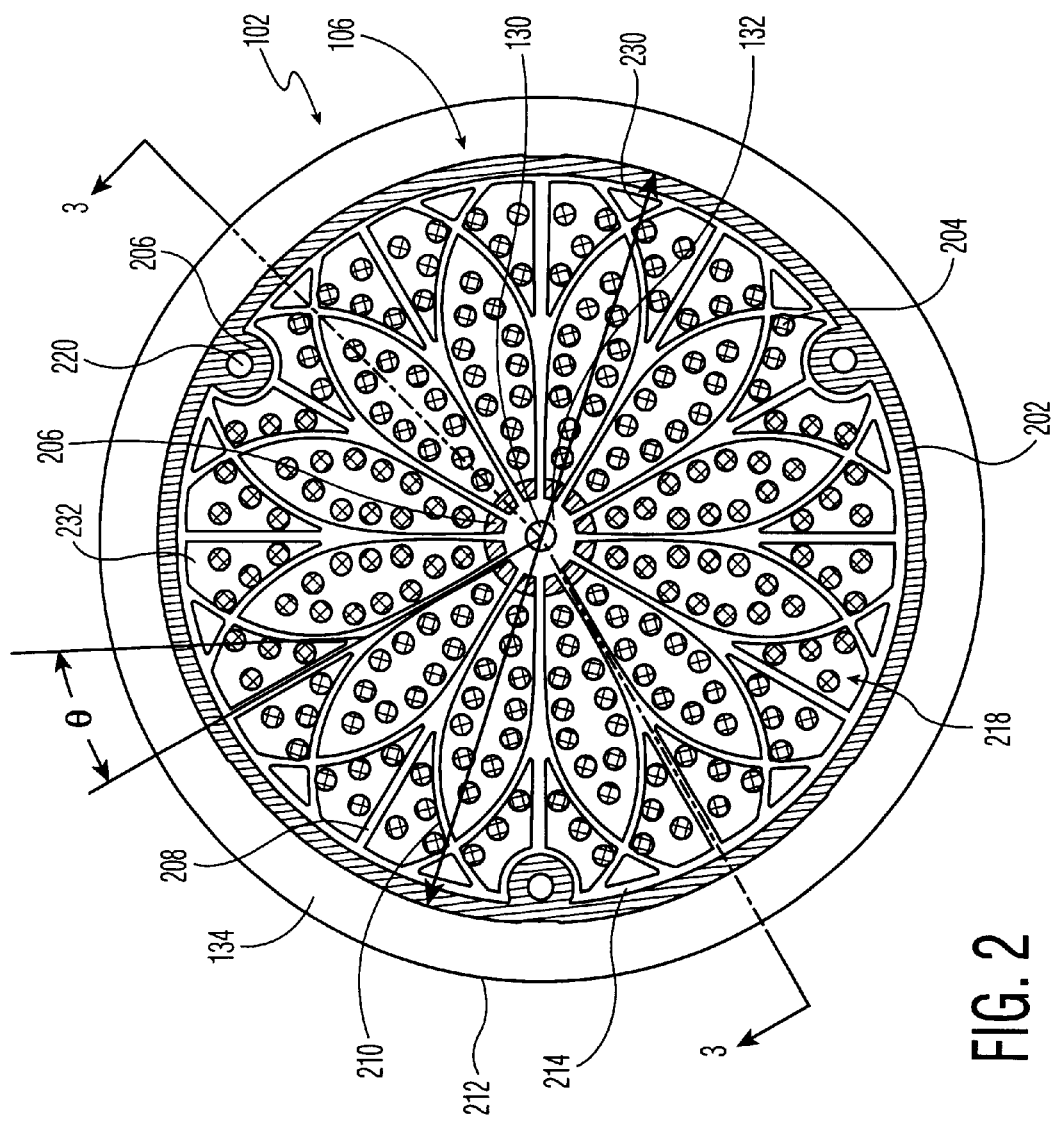
FIG. 2 is a plan view of the substrate support of FIG. 1.

FIG. 2 depicts one embodiment of the upper side 134 of the substrate support 102. The substrate support 102 generally includes a raised outer ring 202 and a plurality of pads 204 extending from a field 232 defined radially inward of the ring 202. The ring 202 may include a plurality of lift pin bosses 206 that circumscribe apertures 220 provided for passage of the lift pins 116 through the substrate support 102. The lift pin bosses 206 may alternatively be positioned radially inwards and separate from the ring 202.

A plurality of channels 208 are formed in the upper side 134 of the substrate support 102. The channels 208 generally are fluidly coupled to and radiate outward from the well 132. At least one of the channels 208 includes at least one branch channel 210 diverging therefrom towards a perimeter 212 of the substrate support 102. The branch channels 208 may be straight or curved. Typically, a portion of the channel 208 proximate the perimeter 212 and branch channels 210 intersect at an angle θ. In one embodiment, the angle θ is less than about 30 degrees to minimize pressure losses of gas flowing through the channels 208, 210.

In one embodiment, the upper side 134 of the support 102 may include a perimeter channel 214. The perimeter channel 214 is typically disposed adjacent the ring 202. Generally, the channels 208 and branch channels 210 are coupled to the perimeter channel 214.

Figure 3A:
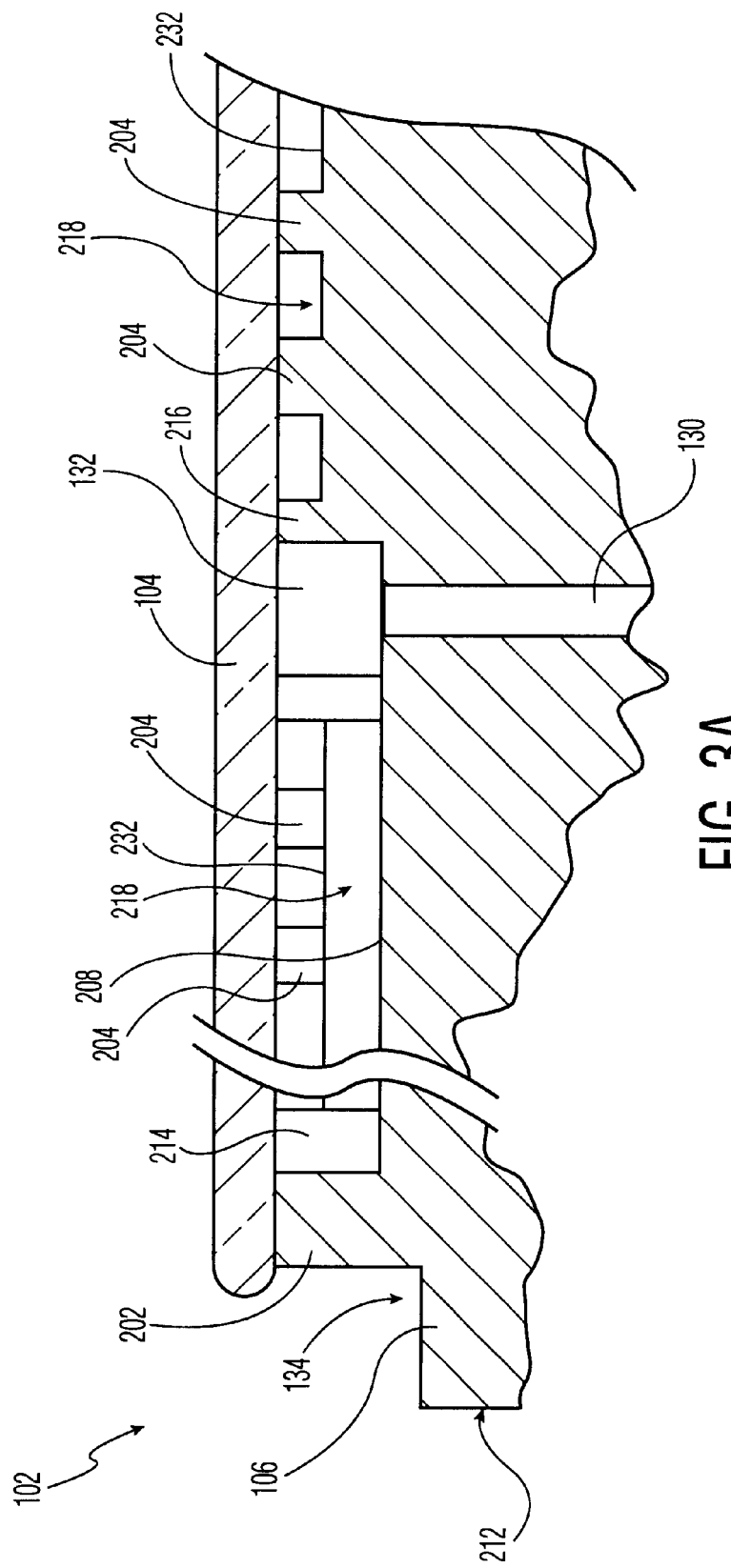
FIG. 3A depicts a sectional view of the substrate support taken along section line 3—3 of FIG. 2.
Figure 3B:
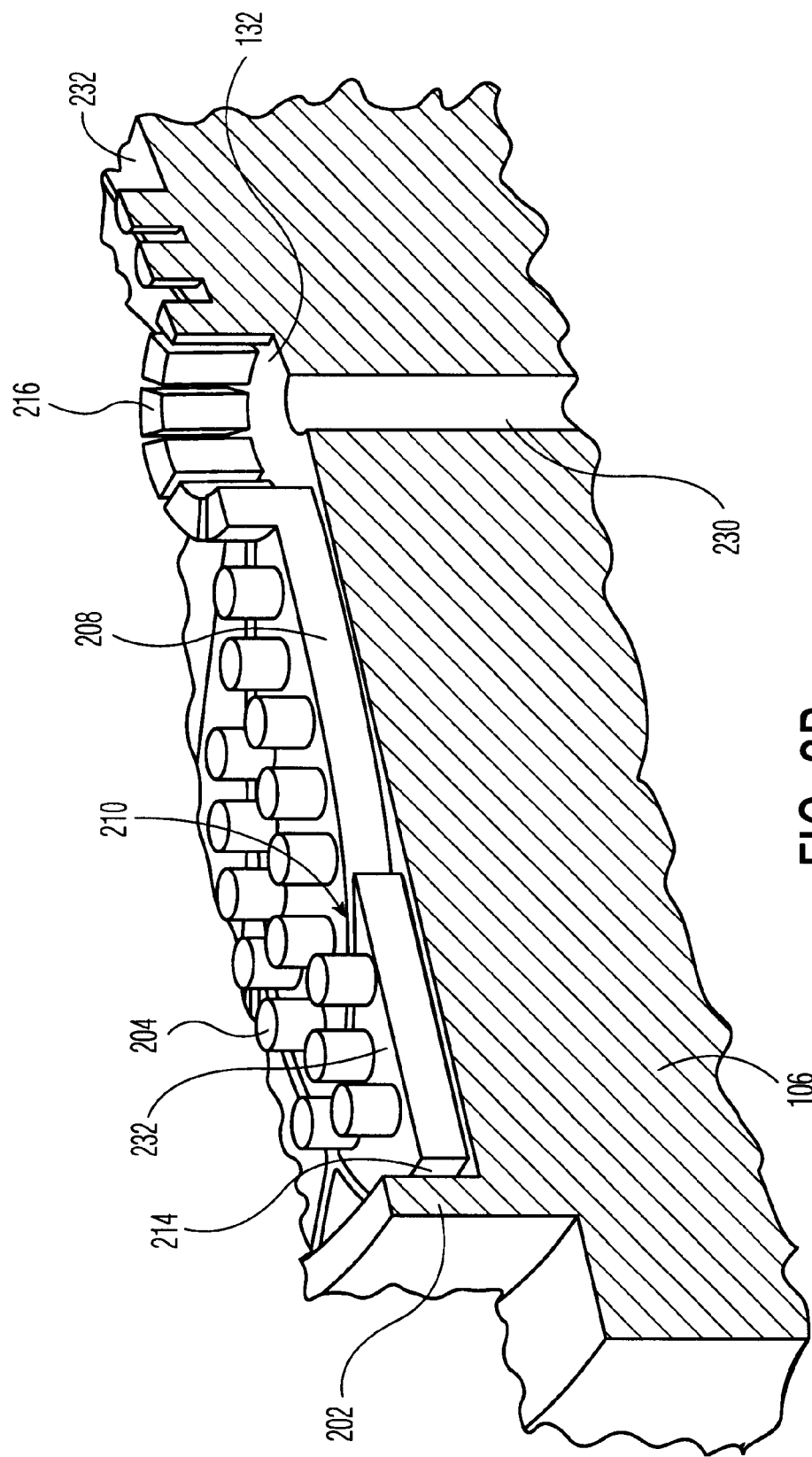
FIG. 3B depicts a perspective view of the substrate support of FIG. 2.

FIG. 3A and FIG. 3B depicts a sectional and perspective views of the substrate support 102 illustrating one embodiment of the topographical features of the support 102. Generally, the ring 202 is formed integrally with the body 106 from a single mass of material. Alternatively, the ring 202 may be comprised of a separate member coupled to the upper side 134 of the body 106. The ring 202 is generally disposed proximate a perimeter 212 of the body 106. The ring 202 generally extends at least about 45 µm above the field 232. In one embodiment, the ring 202 is about 55 µm above the field 232 of the substrate support 102. The ring 202 generally supports the substrate 104 proximate its edge and provides a seal between the substrate and substrate support 102 that prevents backside gas from escaping a plenum 218 defined therebetween.

The pads 204 are generally distributed on the field 232 between the ring 202 and the well 132. The pads 204 generally provide a conduit through which the electrostatic force between the substrate support 102 and substrate is channeled. As power is applied to the electrode 111, opposite charges accumulate on the pad's surface and on a portion of the substrate adjacent the pad 204 thus chucking the substrate through a capacitive effect. Alternatively, the body 106 and pad 204 materials may be chosen to promote chucking of the substrate through a Johnsen-Rahbeck effect.

The pads 204 are typically formed integrally with the body 106 from a single mass of material. Alternatively, the pads 204 may be comprised of separate members coupled to the upper side 134 of the body 106. A description of a pad comprised of a first material and disposed on an electrostatic chuck comprising a second material is described in U.S. Pat. No. 5,656,093 issued Aug. 12, 1997 to Burkhart et al., and is incorporated herein by reference in its entirety.

Each pad 204 may vary in form but typically has a cylindrical shape. Each pad 204 generally extends at least about 45 above the field 232 and has a cross-sectional area of about 20 square mm. In one embodiment, the pads 204 extend about 55 µm above the field 232 of the substrate support 102. The distance between the field 232 and the top of the pads 204 generally enhances heat transfer by the backside gas. Generally, the pads 204 comprise about 30 percent or less of the substrate area defined inside the diameter 230 of the ring 202. This provides adequate contact area between the pads 204 and substrate for the electrostatic force to hold the substrate to the support 102 with backside gas pressures of up to about 15 Torr while maximizing the plenum area for heat transfer through the backside gas.

The well 132 is generally disposed at or near the center of the substrate support 102 and is fluidly connected to the passage 130. The well 132 may have varied geometry although a bore concentrically disposed with the passage 130 is preferred. Generally, the well 132 is at least about 300 µm deep (relate to the field 232) and has a diameter of less than about 40 mm. The increase in diameter between the well 132 and the passage 130 reduces the pressure drop of the gas exiting the passage 130 and allows the gas to flow out towards the perimeter of the support 102 through the channels 208, 210 more efficiently. Moreover, the well 132 causes the backside gas to expand and cool below the surface of the support 102 as the gas to flow from the passage 130 into well 132. As the cooling of the backside gas occurs at the bottom of the well 132 and away from the substrate 104, the center of the substrate 104 is not disproportionately cooled by being proximate the reduction in gas pressure. A well boss 216 generally bounds the well 132 and extends from the upper side 134 to a level substantially co-planar to the ring 202 and pads 204.

Figure 4:
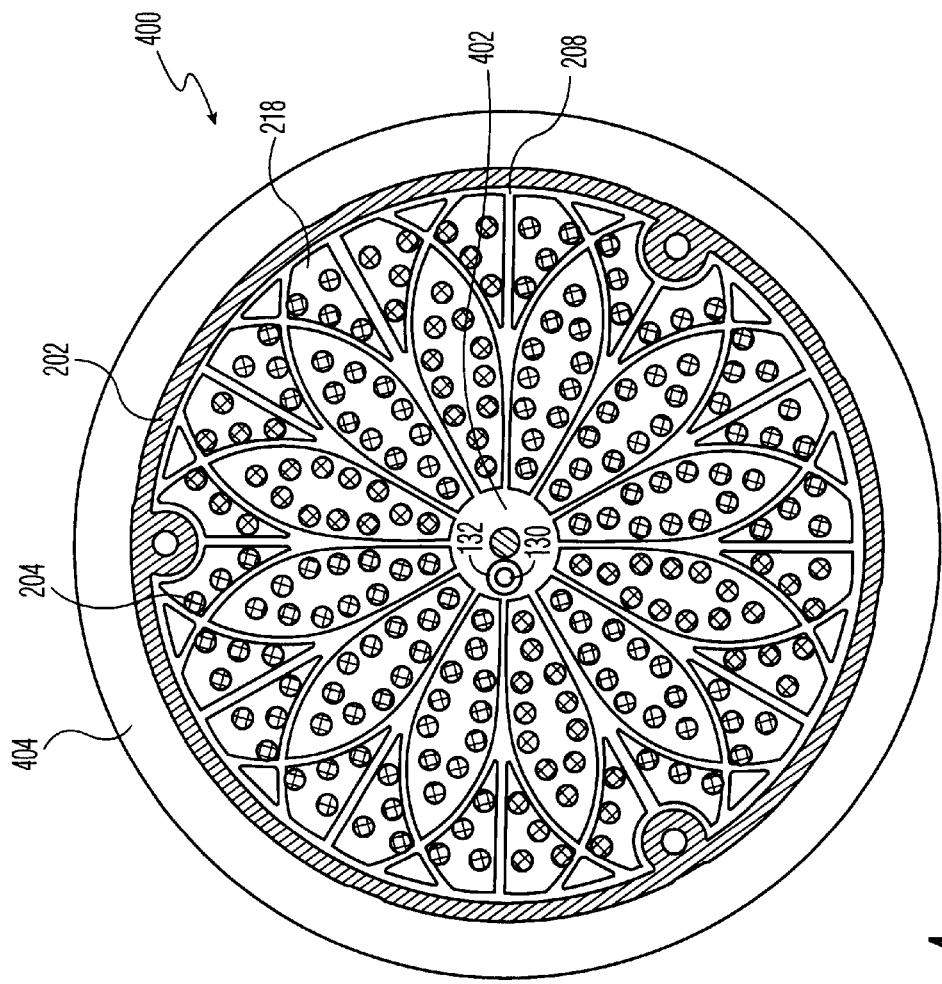
FIG. 4 is a plan view of another embodiment of a substrate support.

FIG. 4 depicts another embodiment of a substrate support 400. Generally, the substrate support 400 is configured similar to the substrate support 102 described with reference to FIGS. 1–3 except that the passage 130 and well 132 are offset from the center of the substrate support 400. To provide uniform distribution of backside gas, a center channel 402 is concentrically disposed in upper surface 404 of the support 400. The channels 208 are coupled to the well 132 by the center channel 402. The center channel 402 may have a varied sectional area that increases in portions of the channel farthest from the intersection of the well 132 and center channel 402. The varied sectional area provides substantially flow of backside gas to each of the channels 208.

Returning to FIGS. 3A and 3B, the channels 208 generally are disposed in a radial orientation on the upper surface 132 of the support 102. The channels 208 generally extend from the well 132 through the well boss 216 to the perimeter channel 214. The channels 208 generally have a cumulative surface area of about 20 percent or less of the substrate area defined inside the diameter 230 of the ring 202. In one embodiment, the channels are about 200 to about 500 µm deep relative to the field 232 and about 1 mm to about 2 mm wide. The secondary channels 210 and the perimeter channel 214 typically are configured with the identical or smaller cross section to the channels 208. The area of the channels 208, 210 and 214 allow the backside gas to flow with minimal pressure drop, resulting in uniform distribution of the backside gas across the plenum 218. The uniform distribution of backside gas enhances the control and uniformity of temperature on the substrate, resulting in improved process performance.

Although the topographical structure of the substrate support 102 has been described with reference to an electrostatic chuck, the heat transfer features provided by the support 102 have utility in other supports (i.e., heaters and susceptor among other) utilizing backside gas between a support and the substrate. While the foregoing is directed to the preferred embodiment of the present invention, other and further embodiments of the invention may be devised without departing from the basic scope thereof, and the scope thereof is determined by the claims that follow.

What is claimed is:

1. A substrate support for supporting a substrate in a process chamber, comprising:
   a body having a first side and a second side bounded by a perimeter;
   a ring extending from the first side proximate the perimeter;
   a perimeter channel disposed in the first side adjacent to and radially inward of the ring;
   a plurality of substrate support pads extending from the first side;
   a well disposed in the first side of the body;
   a fluid passage having a diameter smaller than a diameter of the well disposed through the body and coupled to the well, the passage adapted to provide backside gas to the first side; and
   a plurality of gas flow channels disposed in the first side radially outwards from the well and fluidly coupled to the perimeter channel.

2. The substrate support of claim 1, wherein the body is comprised of ceramic, metal or a combination thereof.

3. The substrate support of claim 1, wherein the pads comprise about 30 percent or less than an area bounded by a perimeter of the ring.

4. The substrate support of claim 1, wherein the pads project at least about 45 μm from the first side.

5. The substrate support of claim 1, wherein the gas flow channels comprise 20 percent or less of an area defined by the ring.

6. The substrate support of claim 5, wherein the gas flow channels have a depth of about 200 to about 500 μm.

7. The substrate support of claim 1, wherein each gas flow channel comprises one or more branch channels diverging from the gas flow channel toward the perimeter at an angle less than about 30 degrees.

8. The substrate support of claim 1, wherein the well has a diameter of at least about 40 mm.

9. The substrate support of claim 1, wherein the well has a depth of at least about 300 μm.

10. The substrate support of claim 1, wherein the substrate support is a susceptor, heater, electrostatic chuck or a combination thereof.

11. The substrate support of claim 1, wherein the perimeter channel, the well and the gas flow channels extend a common depth into the first side.

12. The substrate support of claim 1 further comprising one or more electrodes disposed within the body.

13. A substrate support for supporting a substrate in a process chamber, comprising:
   a ceramic body having a first side and a second side bounded by a perimeter;
   one or more electrodes disposed within the ceramic body;
   a ring integrally extending from the first side proximate the perimeter;
   a plurality of substrate support pads integrally extending from the first side;
   a well disposed in the first side of the body;
   a fluid passage having a diameter smaller than a diameter of the well disposed through the body and coupled to the well, the passage adapted to provide backside gas to the first side;
   a perimeter channel disposed in the first side proximate the ring; and
   a plurality of gas flow channels disposed in the first side fluidly coupling the perimeter channel and the well.

14. The substrate support of claim 13 further comprising a housing sealingly coupled to the second side of the ceramic body and defining a volume therebetween.

15. The substrate support of claim 14 further comprising a temperature control plate disposed in the volume.

16. The substrate support of claim 13, wherein the pads comprise about 30 percent or less than an area bounded by a perimeter of the ring.

17. The substrate support of claim 13, wherein the pads project at least about 45 μm from the first side.

18. The substrate support of claim 13, wherein the gas flow channels comprise 20 percent or less of an area defined by the ring.

19. The substrate support of claim 18, wherein the gas flow channels have a depth of about 200 to about 500 μm.

20. The substrate support of claim 13, wherein each gas flow channel comprises one or more branch channels diverging from the gas flow channel toward the perimeter at an angle less than about 30 degrees.

21. The substrate support of claim 13, wherein the well has a diameter of at least 40 mm and a depth of at least about 300 μm.

22. A substrate support for supporting a substrate in a semiconductor process chamber comprising:
   a ceramic body having a first side and a second side bounded by a perimeter;
   a ring extending from the first side proximate the perimeter;
   a perimeter channel disposed in the first side adjacent to and radially inward of the ring;
   a plurality of substrate support pads integrally extending from the first side;
   a well disposed in the first side of the body;
   a fluid passage having a diameter smaller than a diameter of the well disposed through the body and coupled to the well, the passage adapted to provide backside gas to the first side; and
   a plurality of gas flow channels disposed in the first side fluidly coupling the perimeter channel and the well, the fluid channels having a depth of at least 300 μm.

23. The substrate support of claim 22, wherein the ring, pads and body are comprised of a singular ceramic member.

24. The substrate support of claim 22 further comprising one or more electrodes disposed within the ceramic body.

* * * * *